(«12») United States Patent
Lujan et al.

(10) Patent No.: US 9,263,124 B2
(45) Date of Patent: Feb. 16, 2016

(54) UV SENSOR WITH NONVOLATILE MEMORY USING OXIDE SEMICONDUCTOR FILMS

(71) Applicant: Palo Alto Research Center Incorporated, Palo Alto, CA (US)

(72) Inventors: Rene A. Lujan, Sunnyvale, CA (US); Tse Nga Ng, Sunnyvale, CA (US); Robert A. Street, Palo Alto, CA (US)

(73) Assignee: PALO ALTO RESEARCH CENTER INCORPORATED, Palo Alto, CA (US)

( * ) Notice: Subject to any disclaimer, the term of this patent is extended or adjusted under 35 U.S.C. 154(b) by 93 days.

(21) Appl. No.: 14/133,389

(22) Filed: Dec. 18, 2013

(65) Prior Publication Data

US 2015/0170738 A1   Jun. 18, 2015

(51) Int. Cl.
| | |
|---|---|
| *G11C 11/42* | (2006.01) |
| *H01L 31/167* | (2006.01) |
| *H01L 31/024* | (2014.01) |
| *H01L 31/103* | (2006.01) |
| *H01L 27/144* | (2006.01) |
| *H01L 29/786* | (2006.01) |
| *H01L 25/16* | (2006.01) |
| *G11C 13/00* | (2006.01) |
| *G11C 13/04* | (2006.01) |

(52) U.S. Cl.
CPC ............ *G11C 11/42* (2013.01); *G11C 13/0002* (2013.01); *G11C 13/04* (2013.01); *H01L 25/167* (2013.01); *H01L 27/1446* (2013.01); *H01L 29/7869* (2013.01); *H01L 31/024* (2013.01); *H01L 31/103* (2013.01); *H01L 31/167* (2013.01); *H01L 2924/0002* (2013.01)

(58) Field of Classification Search
CPC ..... G11C 13/047; G11C 11/42; H01L 31/167; H01L 31/103; H01L 31/024
USPC ........................................................ 365/112
See application file for complete search history.

(56) References Cited

U.S. PATENT DOCUMENTS

| | | | |
|---|---|---|---|
| 2010/0001211 A1 * | 1/2010 | Huang et al. | 250/492.1 |
| 2011/0133182 A1 * | 6/2011 | Saito et al. | 257/43 |
| 2012/0313092 A1 * | 12/2012 | Shieh et al. | 257/43 |

* cited by examiner

*Primary Examiner* — Hoai V Ho
*Assistant Examiner* — Tri Hoang
(74) *Attorney, Agent, or Firm* — Marger Johnson

(57) ABSTRACT

A ultra-violet sensor has a gate on a substrate, a dielectric formed over the gate and the substrate, an oxide semiconductor formed over the dielectric, and a source electrode and a drain electrode formed at the edges of the oxide semiconductor. A memory device has an array of ultra-violet sensors, each sensor having a gate on a substrate, a dielectric formed over the gate and the substrate, an oxide semiconductor formed over the dielectric, and a source electrode and a drain electrode formed at the edges of the oxide semiconductor, an array of ultra-violet light sources corresponding to the array of ultra-violet sensors, an array of detectors electrically coupled to the array of ultra-violet sensors, driving circuitry attached to the array of sensors and the ultra-violet light sources to allow addressing of the arrays, and a reset mechanism.

17 Claims, 4 Drawing Sheets

US 9,263,124 B2

UV SENSOR WITH NONVOLATILE MEMORY USING OXIDE SEMICONDUCTOR FILMS

BACKGROUND

Oxide semiconductors show absorption at UV wavelengths and have been previously demonstrated as UV sensors. However, when these are implemented with thin-film transistor sensors, the oxide semiconductors show persistent photoconductivity effect that limits the sensor refresh rate.

However, one can use the persistent conductivity. One possible use would be as built-in memory for a sensing system or for a long-time dose measurement.

DETAILED DESCRIPTION OF THE EMBODIMENTS

Figure 1:
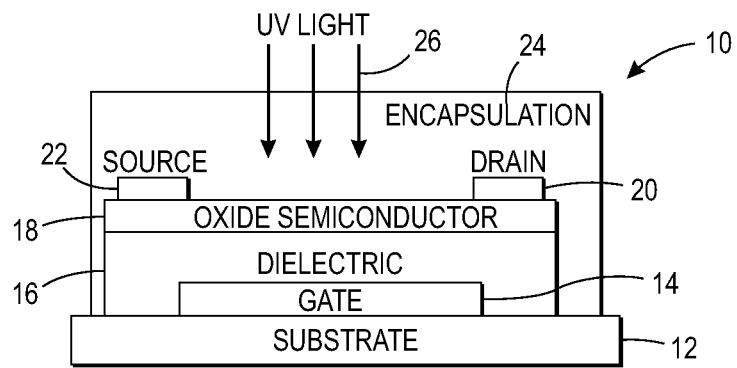
FIG. 1 shows an embodiment of an oxide semiconductor ultra-violet sensor.

FIG. 1 shows an embodiment of an oxide semiconductor ultra-violet sensor 10. This embodiment has a bottom gate architecture for a thin film transistor (TFT) sensor. One should note that the TFT sensor could also have a top gate architecture, as long as the dielectric is transparent to the wavelength of light. The sensor, or sensor cell, 10 has a substrate 12. A gate 14 resides on the substrate in a bottom gate architecture. The substrate will typically consist of glass, however, ceramic, plastic, or other substrate materials may be used. The gate may consist of many different types of conductive materials, such as molybdenum chromium (MoCr), aluminum (Al), or indium tin oxide (ITO).

The dielectric 16 covers the gate and a portion of the substrate. The dielectric may consist of silicon dioxide ($SiO_2$), a mixture of silicon dioxide ($SiO_2$) and silicon nitride ($Si_3N_4$), or other combinations of oxide dielectrics such as aluminum oxide ($Al_2O_3$) or tantalum oxide ($Ta_2O_5$). A coating of an oxide semiconductor then resides on the dielectric. The oxide semiconductor may consist of indium zinc oxide (IZO), indium gallium zinc oxide (IGZO), other quaternary, ternary or binary oxide variations, such as indium gallium oxide. The source 22 and drain 20 electrodes may consist of the same conductive materials as the gate electrode, or may be of a different composition.

These sensor cells may be used as individual point monitors or integrated into sensor arrays for detection of UV light 26. The arrays may be arranged as passive or active matrix arrays, or as individual point monitors. If the sensor is to be saturated, one can increase the sensor saturation point by coating a ultra-violet absorbing polymer such as PMMA (polymethyl methacrylate) or an oxide heterostructure.

Figure 2:
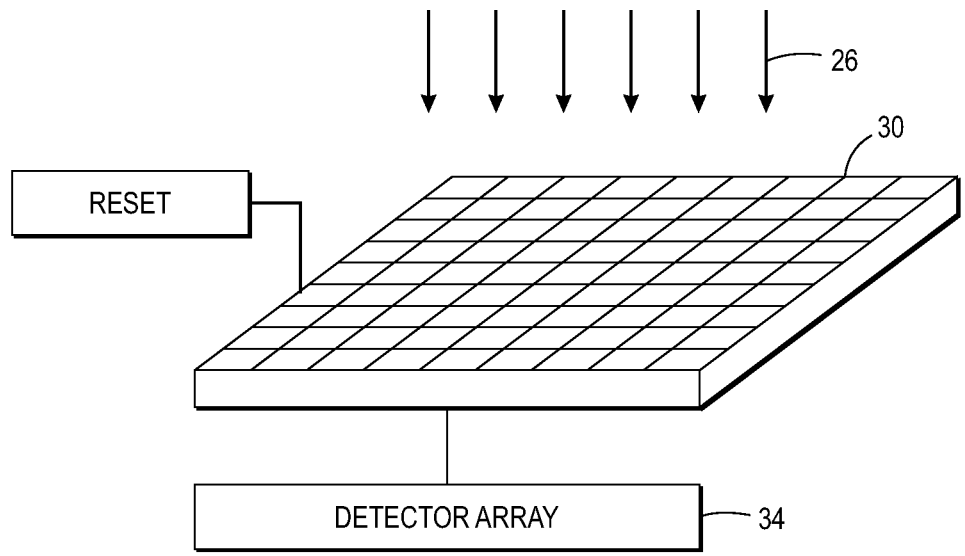
FIG. 2 shows an embodiment of an ultra-violet sensing system.

The sensor cells may be organized into an array of sensors such as 30 in FIG. 2. Each sensor will produce current proportional to the amount of ultra-violet light to which it has been exposed. The persistent photoconductivity of the sensor can become an advantage, since it allows the sensor array to function as on-board memory. Repeated exposures or prolonged exposure to ultra-violet light will cause the current to increase. A detector array 34 such as an array of sense amplifiers detects the current from the array of ultra-violet sensors.

Because of the persistent photoconductivity, the sensors need to be reset somehow to allow the sensor to re-initialize. The oxide semiconductors can reset upon receiving a positive gate bias applied to the transistors or upon heating of the substrate. This type of reset mechanism 32 connects either to gates of the transistors electrically or to the substrate thermally.

Figure 3:
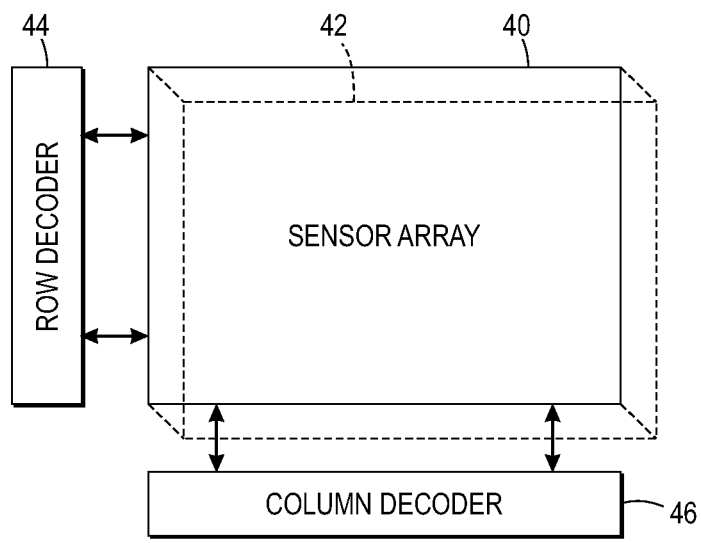
FIG. 3 shows an embodiment of an ultra-violet memory system.

FIG. 3 shows an embodiment of a memory array using the ultra-violet sensors. The system relies upon the photoconductivity persistence to retain information written to the sensors using an array of ultra-violet light sources. The array of sensors 40 are configured as an array of memory cells. The cells are written with data by corresponding ultra-violet light sources in the array 42. Examples of ultra-violet light sources include light emitting diodes. Driving circuitry for the memory array, such as row decoder 44 and column decoder 46, addresses the array of cells as memory cells. A further array of sense amplifiers or other detection circuitry to detect those cells that are generating current may also be employed.

Figure 4:
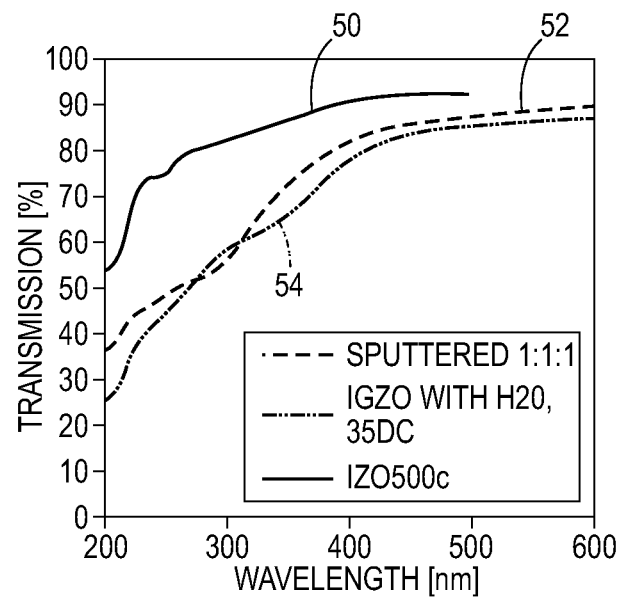
FIG. 4 shows a graph of absorption spectra of ultra-violet oxide semiconductors.

FIG. 4 shows an absorption spectra of oxide semiconductors. Curve 50 shows the absorption spectra of a film of indium zinc oxide (IZO) deposited from solution and annealed at 500C. Curve 52 shows the spectra of an indium gallium zinc oxide (IGZO) 1:1:1 film sputtered. Curve 54 shows the spectra of an (IGZO) film, with water added in the formulation and annealed at 350C. Most sputtered films have a ratio of metals such as 1:1:1, or 2:1:1. In the embodiments shown here the film includes such ratios such as 70:15:15. One of the components of the film has a ratio of 4 to 1 to at least one of the other components.

Figure 5:
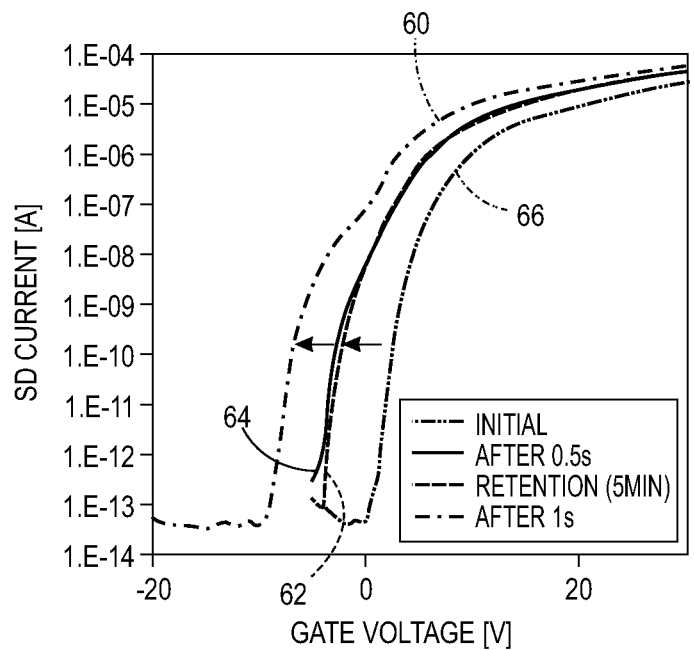
FIG. 5 shows a graph of transfer characteristics for an oxide semiconductor thin film transistor.
Figure 6:
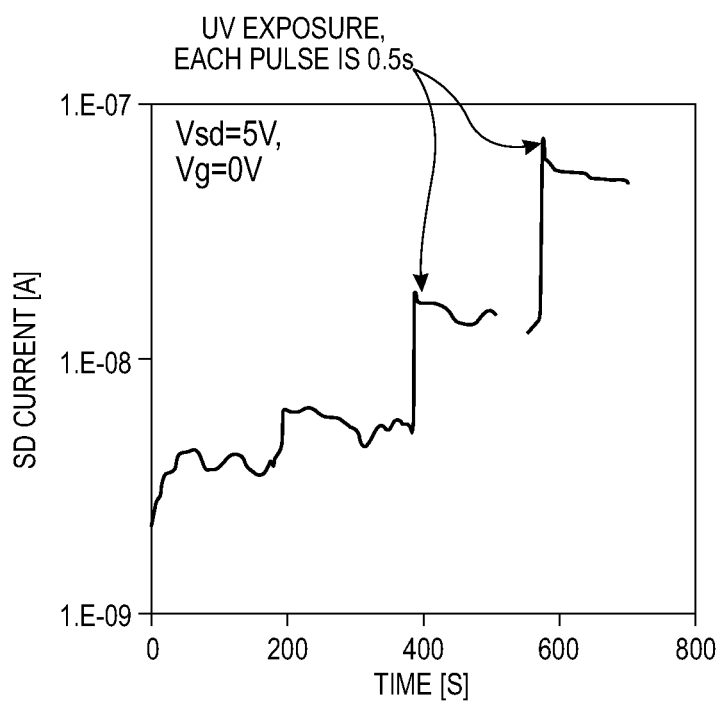
FIG. 6 shows a graph of a thin film transistor current versus ultra-violet exposure.

FIG. 5 shows transfer characteristics of an IZO TFT that shifts with increasing exposure to ultra-violet light. The ultra-violet light has a peak at 365 nm (0.1 mW/cm$^2$). The curve 66 shows the initial transfer characteristics, 62 shows retention after 5 minutes. Curve 64 shows the response after 0.5 seconds, and curve shows the characteristics after 1 second. FIG. 6 shows the TFT current versus time upon ultra-violet light exposure, where each pulse is separated by 0.5s.

Figure 7:
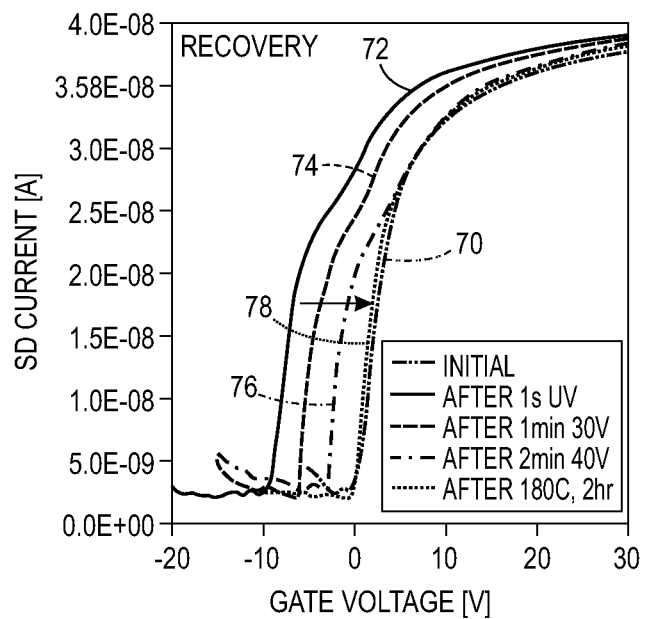
FIG. 7 shows a graph of recovery of TFT transfer characteristics.
Figure 8:
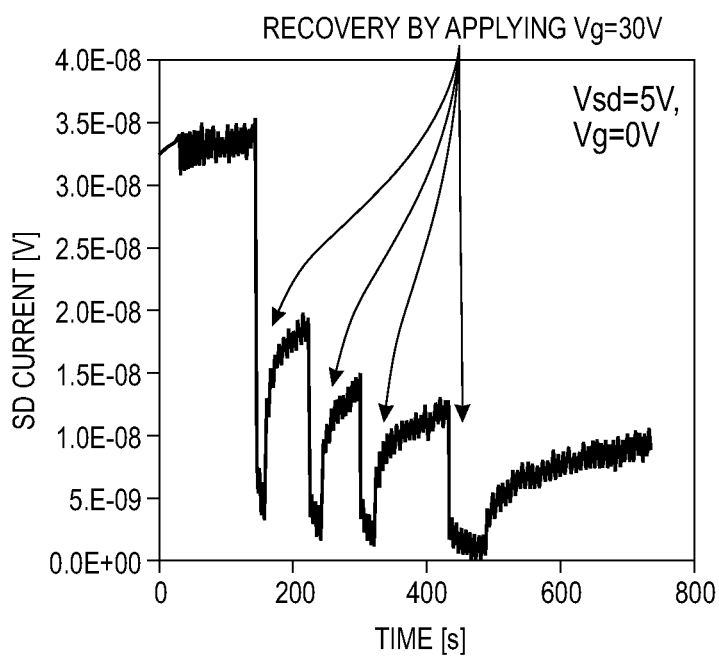
FIG. 8 shows a graph of TFT current versus when a positive gate pulse is applied.

FIG. 7 shows the recovery characteristics of an oxide semiconductor UV sensor when positive gate bias is applied. Curve 70 shows the initial response. Curve 72 shows the response after 1 second of exposure, curve 74 after 1 minute and 30 V, curve 76 after 2 minutes and 40 V. Curve 78 shows the response after the substrate is heated to 180C for 2 hours. FIG. 8 shows the current reduction upon application of the positive gate pulses.

The manufacture of these devices may take many forms. The process may deposit the sensor materials and ultra-violet absorbing layer using relatively low-cost printing solutions, including spin-coating, inkjet printing, slot-die coating, or spraying. For example, the oxide semiconductor may be deposited from a sol gel solution of metal nitrate precursors. The films may also be deposited by spin coating rather than sputtering, which has the advantage of being less expensive. Typically, when making a transistor, spin coating and some other processes are avoided. However, the manufacturing process here is optimized for ultra-violet light absorption rather than the transistor manufacture.

In this manner, a ultra-violet sensor may be manufactured using well-known transistor manufacturing techniques. The sensor has the advantage of acting as its own memory, as well as being able to reset with a fairly simple reset mechanism.

It will be appreciated that several of the above-disclosed and other features and functions, or alternatives thereof, may be desirably combined into many other different systems or applications. Also that various presently unforeseen or unanticipated alternatives, modifications, variations, or improvements therein may be subsequently made by those skilled in the art which are also intended to be encompassed by the following claims.

What is claimed is:

1. A ultra-violet sensor memory cell, comprising:
   a gate on a substrate;
   a dielectric formed over the gate and the substrate;
   an oxide semiconductor formed over the dielectric, wherein the oxide semiconductor is comprised of a mixture of component materials, one of the component materials having a ratio of at least three to one to one of the other materials; the oxide semiconductor having a characteristic persistent photoconductivity that stores data;
   a source electrode and a drain electrode formed at the edges of the oxide semiconductor; and
   at least one detector electrically coupled to the ultra-violet sensor to read the data stored in the sensory memory cell.

2. The ultra-violet sensor of claim 1, wherein the dielectric is selected from the group consisting of silicon dioxide, silicon dioxide and silicon nitride, aluminum oxide and tantalum oxide.

3. The ultra-violet sensor of claim 1, wherein the oxide semiconductor is selected from the group consisting of indium gallium zinc oxide, indium zinc oxide, indium gallium tin oxide, indium gallium oxide.

4. The ultra-violet sensor of claim 1, wherein the source and drain electrodes are one of the group consisting of molybdenum chromium, aluminum and indium tin oxide.

5. The ultra-violet sensor of claim 1, further comprising an ultra-violet polymer over the oxide semiconductor.

6. The ultra-violet sensor of claim 5, wherein the ultra-violet polymer is selected from one of the group consisting of PMMA, and an oxide heterostructure.

7. The ultra-violet sensor of claim 5, wherein the ultra-violet polymer encapsulates the dielectric, the oxide semiconductor, the source and drain.

8. The ultra-violet sensor of claim 1, further comprising a voltage source electrically connected to the gate.

9. The ultra-violet sensor of claim 1, further comprising a heater thermally coupled to the substrate.

10. The ultra-violet sensor of claim 1, wherein the mixture of materials comprises a mixture of 70%:15%:15% of indium gallium zinc oxide.

11. An ultra-violet sensor device, comprising:
    an array of ultra-violet sensors, each sensor comprising:
        a gate on a substrate;
        a dielectric formed over the gate and the substrate;
        an oxide semiconductor formed over the dielectric, the oxide semiconductor comprises of a mixture of materials in which one material has a ratio of at least three to one to one other material in the mixture; and
        a source electrode and a drain electrode formed at the edges of the oxide semiconductor; and
    an array of current sensors electrically coupled to the array of ultra-violet sensors; to detect which ones of the ultra-violet sensors are conducting current; and
    a reset mechanism connected to the array of ultra-violate sensors capable of reducing current in the ultra-violet sensors to set them to zero.

12. The sensor device of claim 11, wherein the reset mechanism comprises a heater thermally coupled to the substrate.

13. The sensor device of claim 11, wherein the reset mechanism comprises a voltage supply electrically coupled to the gate.

14. A memory device, comprising:
    an array of ultra-violet sensors, each sensor comprising:
        a gate on a substrate;
        a dielectric formed over the gate and the substrate;
        an oxide semiconductor formed over the dielectric; and
        a source electrode and a drain electrode formed at the edges of the oxide semiconductor;
    an array of ultra-violet light sources corresponding to the array of ultra-violet sensors arranged to write data to the array of ultra-violet sensors;
    an array of detectors electrically coupled to the array of ultra-violet sensors, the detectors to detect which sensors are conducting current;
    driving circuitry attached to the array of sensors and the ultra-violet light sources to allow addressing of the arrays to read from and write to the array of ultra-violet sensors; and
    a reset mechanism capable of reducing the current in the ultra-violet sensors to set the sensors to zero.

15. The memory device of claim 14, wherein the array of ultra-violet light sources comprise of ultra-violet light emitting diodes.

16. The memory device of claim 14, wherein the reset mechanism comprises a heater thermally coupled to the substrate.

17. The memory device of claim 14, wherein the reset mechanism comprises a voltage supply electrically coupled to the gates of the array of ultra-violet sensors.

* * * * *